United States Patent
Kinsella (10) Patent No.: US 10,162,008 B2
(45) Date of Patent: Dec. 25, 2018

(54) MANUAL AND AUTOMATED NON-DESTRUCTIVE TESTING FOR SHORT-CIRCUIT AND GROUND FAULT CONDITIONS IN BRANCH MOTOR CIRCUITS

(71) Applicant: James J. Kinsella, Brentwood, TN (US)

(72) Inventor: James J. Kinsella, Brentwood, TN (US)

(*) Notice: Subject to any disclaimer, the term of this patent is extended or adjusted under 35 U.S.C. 154(b) by 0 days.

(21) Appl. No.: 15/683,749

(22) Filed: Aug. 22, 2017

(65) Prior Publication Data

US 2017/0350942 A1 Dec. 7, 2017

Related U.S. Application Data

(63) Continuation-in-part of application No. 14/473,383, filed on Aug. 29, 2014.

(51) Int. Cl.
| | | |
|---|---|---|
| G01R 31/34 | (2006.01) | |
| G01R 19/165 | (2006.01) | |
| G01R 31/02 | (2006.01) | |
| G01R 31/327 | (2006.01) | |
| G01R 31/42 | (2006.01) | |

(52) U.S. Cl.
CPC ........... *G01R 31/34* (2013.01); *G01R 19/165* (2013.01); *G01R 31/025* (2013.01); *G01R 31/3277* (2013.01); *G01R 31/42* (2013.01)

(58) Field of Classification Search
None
See application file for complete search history.

(56) References Cited

U.S. PATENT DOCUMENTS

| | | | |
|---|---|---|---|
| 6,049,284 A * | 4/2000 | Heuer | F16P 3/08 |
| | | | 318/671 |
| 6,452,767 B1 * | 9/2002 | Brooks | H01H 71/125 |
| | | | 361/42 |
| 7,535,234 B2 * | 5/2009 | Mernyk | G01R 31/1272 |
| | | | 324/536 |

* cited by examiner

*Primary Examiner* — Melissa Koval
*Assistant Examiner* — Nasima Monsur
(74) *Attorney, Agent, or Firm* — Robert C. Strawbrich, Esq.

(57) ABSTRACT

A test circuit performs fault detection tests on a motor branch circuit, to detect pre-existing faults before a motor start-up to pre-empt potential damage to the motor branch circuit therefrom. The test circuit is configured to be coupled to the phase lines of a motor branch circuit at a set of test points strategically located on the phase lines. The test circuit includes test lines that are each coupled to a different one of the phase lines at one of the set of test points. The test circuit includes a test controller that, during a test mode, sequentially presents a low voltage supply to each phase line through the test line coupled thereto, to test for ground faults then sequentially couples the low voltage supply across each possible pairing of the phase lines to test for line-to-line faults. The test mode can be initiated manually or automatically.

20 Claims, 6 Drawing Sheets

MANUAL AND AUTOMATED NON-DESTRUCTIVE TESTING FOR SHORT-CIRCUIT AND GROUND FAULT CONDITIONS IN BRANCH MOTOR CIRCUITS

CROSS-REFERENCE TO RELATED APPLICATIONS

This application claims priority as a continuation-in-part of U.S. application Ser. No. 14/473,383, filed Aug. 29, 2014 and titled "NON-DESTRUCTIVE SHORT CIRCUIT TESTING FOR ELECTRICALLY OPERATED CIRCUIT BREAKERS," and which is hereby incorporated herein in its entirety by this reference.

FIELD OF THE INVENTION

The invention relates to testing for the existence of fault conditions in motor branch circuits, and more particularly to manual and automated testing for short-circuit and ground fault conditions that is non-destructive to components of such circuits.

BACKGROUND OF THE INVENTION

The electric motor is at the core of most industrial processes, and is usually powered using three-phase AC power that is delivered to the motor's three phase coils through three branches of a motor branch circuit. Industrial motor branch circuit installations can vary greatly in their physical and parametric characteristics, as a function of their application. These include variations in motor size, required power and the physical layout of the circuit itself. Because industrial applications often have very large power requirements, the AC voltage supplied to such circuits can be in the many hundreds of volts, and the current drawn under typical load conditions can be in the tens or even hundreds of amps. Short-circuit currents resulting from faults present at motor start-up can have magnitudes that can threaten human personnel and often damage/destroy components in the circuit that can be costly to replace.

As such, various regulatory organizations have promulgated safety precautions/procedures that must be met for such installations. For example, circuit breakers are required to interrupt the high voltage system power supply from the branch circuit in mid-operation when load currents are detected that exceed the maximum load current of the motor starter by some pre-determined percentage. Because the circuit breakers are relatively slow to react, motor control components are often exposed to currents that exceed the components' maximum rating.

Motor branch circuit components are prone to fatigue and destruction when operated in the presence of such fault conditions. It is common for such faults to exist prior to motor start-up, and can be created inadvertently during maintenance/repair of the circuit. For example, ground faults can be created through the wearing of insulation on the cables, and short-circuits between the phase cables can be established by a metal tool or other materials that are accidentally left across the cable terminations. The motor can experience ground faults through internal coil insulation wear, that can occur over time. These types of faults that are not always readily apparent to personnel during a pre-start-up inspection. Motor control circuit components such as contactors or inverters of motor branch motor circuits can also be compromised internally, leading to ground fault conditions that are not readily discernable from visual inspection.

The technology used in motor branch circuits has remained virtually unchanged for many years. Safety requirements promulgated by various safety organizations do specify the use of various fault detection schemes and components for shutting down an operating motor branch circuit when the presence of faults is detected during normal operation of the motor branch circuit. These regulatory bodies do not, however, specify schemes for prophylactic testing for fault conditions that can detect the existence of such faults before starting the motor circuit. Rather, any testing upon start-up has been heretofore accomplished by simply energizing the branch circuit with system power (typically through closing of circuit breakers) with an expectation of circuit integrity and hoping that motor branch circuit components are not destroyed due to an undiscovered pre-existing fault condition.

If a serious enough fault does exist prior to start-up, components in a motor branch circuit can be weakened or destroyed before the circuit breaker opens the circuit breakers to isolate the motor branch circuit from system power. Personnel can then resolve the fault conditions manually, often without any initial indication of the location or nature of the fault. Moreover, long-developing faults such as ground faults or motor coil faults, which have not yet reached a level of criticality that will cause the safety components to open the circuit upon start-up, will simply not be detected during start-up if they are not yet severe enough to be detected during normal operation. Rather, they may reach an inevitable failure during operation of the installation instead, requiring an emergency shut-down and the potential for costly repairs. Thus, any testing of motor branch circuits for faults largely heretofore has relied on operational detection schemes operating under full system power, which can lead to destruction of components and can create dangerous conditions that must be cleared before operation can resume.

SUMMARY OF THE INVENTION

In one aspect of the invention, a test circuit performs preemptive, nondestructive detection of faults in a motor branch circuit before motor start-up. The motor branch circuit includes at least two phase lines, each coupling one phase inductor (i.e. coil) of a motor to one phase of a branch circuit AC supply voltage through a circuit breaker. The test circuit includes a low voltage power supply, a primary isolating means, a test controller and one or more test lines. Each test line is coupled to a different one of the phase lines at a unique one of a primary set of test points, the primary isolating means for conductively coupling each of the test lines to the phase line at the unique one of the set of test points to which it is coupled when in a closed state, and for isolating each of the test lines from the phase line to which it is coupled when in an open state, each of the test lines including.

Each of the one or more test lines includes a current detector for sensing the magnitude of current flowing in the test line, and a first switching means for coupling and decoupling, in response to a first control signal from the test controller, a positive terminal of the low voltage supply to the phase line to which the test line is coupled when the primary isolating means is in a closed state. At least some of the test lines further include a second switching means for coupling and decoupling, in response to a second control signal from the controller, a negative terminal of the low voltage supply to the phase line to which the test line is coupled when the primary isolating means is in a closed state.

The test circuit is placed in a test mode, the test controller is configured to perform a short-circuit test sequence. The short-circuit test sequence includes sequentially controlling the test lines to present the test voltage across each possible pairing of the phase lines coupled thereto. The magnitude of current flowing through each of the pairs of test lines is sensed using the current sensor of at least one of the paired test lines while the test voltage is applied across the pairing. The presence of a line-to-line fault between any of the pairs of phase lines is identified when the magnitude of the detected current for the pairing exceeds an expected current by some predetermined threshold.

In another embodiment of the invention, the motor branch circuit includes a motor control circuit. The outputs of the motor control circuit are coupled to the motor through the phase conducting cables. Each of the primary set of test points are located at a termination of a different one of the phase conducting cables between the outputs of the motor control circuit and the motor.

In other embodiments, the test circuit is configured to enter the test mode in response to a manually actuated test mode control signal being received by the test controller while the branch circuit AC supply voltage is electrically isolated from the primary set of test points by the circuit breaker in its open state.

In another embodiment, the test circuit is configured to enter the test mode automatically in response to an automated test mode control signal that can be received by an input of the test controller. The automated test mode control signal is generated in response to the circuit breaker being closed to enable motor start-up. The branch circuit AC supply voltage is electrically isolated from the primary set of test points by an isolating circuit that is maintained in an open state to suppress motor start-up for at least while the test circuit is in test mode.

In still another embodiment, the contactor is maintained in its open state by the test controller until the circuit breaker is opened whenever at least one fault has been detected by the test circuit during test mode.

In a further embodiment, the test controller is further configured to perform a ground fault test when in the test mode that includes sequentially controlling each of the test lines, in turn, using the first switching means, to apply the positive terminal of the low voltage supply as a test voltage to the phase line coupled thereto. The presence of a ground fault is determined to be present for any of the phase lines when a magnitude of current detected by the current sensor of the test line, when coupled to the test voltage, exceeds a predetermined ground fault threshold with the test voltage applied thereto.

In yet another embodiment, the motor control circuit is a motor starter including a contactor for controlling the motor during start-up. The contactor of the motor starter is controlled by the test controller to remain locked in an open state by the during test mode.

In a further embodiment, the motor control circuit is an inverter circuit. In this case, a contactor is placed between the circuit breaker and the input of the inverter circuit, and is controlled by the test controller to remain in an open state during test mode, and is maintained by the test controller in a closed state during normal operation of the motor branch circuit.

In another embodiment, the first and second switching means are bi-directional and the low voltage supply is AC.

In a further embodiment, the magnitude of the current detected by the current sensor of each test line is transmitted to the test controller when the test line is under test, and the test controller compares the sensed magnitude to the predetermined short-circuit threshold to identify a short circuit fault being present in any pairing where the magnitude exceeds the threshold.

In a still further embodiment, the test controller displays information regarding each identified short-circuit fault through a GUI (graphical user interface), including the pairing associated with each identified short-circuit fault.

In an embodiment, a secondary set of test points are located on the phase lines at the inputs of the inverter, and each of the secondary set of test points is located on a different one of the one or more phase lines, each test line being coupled to a unique one of the test points through a secondary isolating means is closed and the primary isolating means is open.

In an embodiment, the test controller is configured to perform the short-circuit test sequence and the ground fault test sequence at the secondary set of test points when the test controller closes the secondary isolating means and the primary isolating means is open. The test sequences can be performed at either one of the primary and secondary sets of test points, or both, one set of test points at a time.

In another aspect of the invention, a test circuit performs preemptive and therefore nondestructive detection of faults in a motor branch circuit before motor start-up. The motor branch circuit includes at least two phase lines, each coupling one phase inductor of a motor to a different phase of a branch circuit AC supply voltage through a circuit breaker. The test circuit includes a low voltage power supply, a primary isolating means, a test controller and one or more test lines.

Each test line is coupled to a different one of the phase lines at a unique one of a primary set of test points. The primary isolating means is for conductively coupling each of the test lines to the phase line at the unique one of the set of test points to which it is coupled when in a closed state. The primary isolating means is further for isolating each of the test lines from the phase line to which it is coupled when in an open state. Each of the test lines includes a current detector for sensing current flowing in the test line. Each test line also includes and a switching means for coupling and decoupling, in response to a first control signal from the test controller, a positive terminal of the low voltage supply to the phase line to which the test line is coupled when the primary isolating means is in a closed state. When the test circuit is placed in a test mode in response to a test mode control signal being received by the test controller, the test controller is configured to perform a ground fault test, which includes sequentially controlling each of the test lines, in turn, using the first switching means, to apply the positive terminal of the low voltage supply to the phase line coupled thereto. A ground fault is deemed to be present for any of the phase lines when a magnitude of current detected by the current sensor of the test line exceeds a predetermined ground fault threshold with the test voltage applied thereto.

In another aspect of the invention, a method for nondestructive detection of faults in a motor branch circuit is performed for a motor branch circuit that has two or more phase lines. Each of the phase lines couples one phase inductor of a motor to a different phase of a branch circuit AC supply voltage through a circuit breaker. The circuit breaker couples and decouples the phase lines from the branch circuit AC supply voltage. The method includes isolating the AC supply voltage from at least a primary set of test points, each test point of the set located on a different one of the phase lines. A ground fault test sequence is performed that includes applying a low voltage supply as test voltage sequentially to each of the phase lines at their respective test points. The magnitude of current flowing in each one of the phase lines is sensed while the test voltage is being applied thereto. The presence of a ground fault is identified and associated with the at least one phase line in which current flow is of a magnitude that exceeds a predetermined ground fault threshold.

A line-to-line short circuit test sequence is also performed, in which the low voltage supply is applied as a test voltage, sequentially across each possible pairing of the phase lines at their respective test points. The magnitude of current flowing through each of the pairings of the phase lines is sensed as the test voltage is applied, and the presence of a line-to-line fault between the phase lines of each pairing is identified for which the magnitude of the sensed current exceeds an expected current flow by a predetermined short-circuit threshold.

In another embodiment, the test sequences are performed automatically in response to entering a test mode. First, closing of the circuit breaker to enable motor start-up is detected, and in response, test mode is entered. Upon entering the mode, the AC supply voltage is isolated from the set of test points using an isolating contactor in a normally open state, wherein the open state is maintained for at least the duration of the test mode to suppress motor start-up for at least the duration of test mode.

In a further embodiment, the motor branch circuit includes a motor starter and the motor starter includes a contactor that controls the motor during start-up and normal operation. The contactor of the motor starter is controlled by the test controller to remain in the open state during test mode.

In another embodiment, the motor branch circuit includes an inverter circuit and an isolating contactor is placed between the circuit breaker and the input of the inverter circuit, the isolating contactor being controlled by the test controller to remain locked in the open state during test mode.

DETAILED DESCRIPTION

Embodiments of a test circuit are disclosed that are configured to perform a sequence of tests prophylactically, at strategically chosen sets of test points along the conductive phase lines of a motor branch circuit prior to start-up. The sequences of tests are configured to detect faults in the motor branch circuit prior to motor start-up, as the existence of such faults during motor start-up can result in damage to components and/or present conditions that are dangerous to human personnel. The sequences of tests can be initiated manually, or automatically in response to an initiation of a motor start-up.

Embodiments of the test circuit of the invention are configured to detect the presence of both ground faults (i.e. unacceptable leakage currents to ground) and short circuits across phase lines, by sequentially testing each of the phase lines of the branch motor circuit, in turn, at the chosen test points, in accordance with methods of the invention as described below. The test circuit is configured to perform a first test sequence that detects the presence of ground faults, and a second test sequence by which to detect short-circuit or "line-to-line" faults. The test circuit can be employed for virtually all types of motor branch circuits, regardless of their parametric characteristics and/or circuit topologies. The test circuit can be coupled to one or more sets of strategically chosen test points at which the test circuit is coupled to the motor branch circuit.

As previously discussed, ground faults can typically result from wear/damage to branch motor circuit components such as inverters, motor starter contactors, cables and the motor itself. Ground faults can also result from the wearing of insulating material on the conducting cables that each deliver one of the requisite phases of the AC system power supply to the motor. The test circuit of the invention performs this ground fault testing process as part of a first test sequence by sequentially presenting, one-at-a-time and in turn, a relatively low voltage supply as a test voltage to each test point of each phase of the motor branch circuit. These test points can be physically located, for example, at an electrical termination of the phase cable for each branch. The test circuit then measures current flow that results therefrom to detect the presence of unacceptable levels current flowing to earth ground through the conducting cable.

Short-circuit (or line-to-line faults) can also occur between adjacent phase cables of the motor branch circuit. Such faults can occur when any sort of conducting material inadvertently bridges or spans an adjacent pair of conducting cables or phase lines. For example, metal tools are sometimes inadvertently left behind after performance of repair/maintenance. These faults can be particularly dangerous because of the amount of current drawn by the short-circuiting of low-impedance lines carrying phases of a high voltage power source. The test circuit of the invention accomplishes this testing process as part of the second test sequence, by presenting the same test voltage sequentially across each possible pairing of the phase lines in turn, and then measuring current flowing through each pairing to detect the presence of unacceptable magnitudes indicating the presence of a line-to-line short-circuit fault.

Because motor circuits can operate at high voltages and currents, the system AC power used to power the motor must be isolated from the test points during testing, or the test lines of the test circuit (including components thereof) coupled at those points can be destroyed. Preferably, the test sequences of the invention are performed by the test circuit of the invention as a prophylactic measure prior to a motor start/restart, for example after a branch motor circuit has been shut down for some time for maintenance/repair. It can also be performed when the motor branch circuit is being placed in service for the first time.

In an embodiment, the test sequences can be initiated by manually placing the motor branch circuit into a test mode through the actuation of, for example, a mechanical contact switch. System power must be isolated from the motor and the test points during testing, and thus it is incumbent on the operator to first ensure that the circuit breaker is open before initiating the test, and then ensuring that it remains open until after the testing sequences have been fully completed. The test initiation switch, when actuated, provides a signal to a controller of the test circuit that initiates the test sequences in response thereto. If the presence of one or more faults is detected, a visual and/or auditory alarm can be provided to warn an operator not to start up the motor (by closing the circuit breaker), until the identified fault has been cleared. In this way, damage to the motor branch circuit can be avoided during start-up by pre-emptively detecting and removing them prior to starting the motor.

In another embodiment, the motor branch circuit can be placed into a test mode automatically every time system power is provided to the motor branch circuit to enable a motor start-up. In an embodiment, the presence of system power at the load side of the circuit breaker can be detected, which signals an operator's attempt to enable a start of the motor by closing the circuit breaker. In this embodiment, a device such as a voltage controlled relay can be used to detect the presence of system AC power being present at the load side of the circuit breaker.

For automated testing before the motor starts up, the motor control circuit must not be permitted to become operational until the testing sequences have been successfully completed. An electronically controllable isolating circuit in the form of an electro-mechanical device such as a contactor, can be used to delay motor start-up until testing is complete. For branch motor circuits that employ a motor starter circuit, a contactor is already used to control the availability of system power to the motor for purpose of starting and stopping the motor. A controller circuit of the test circuit can therefore provide a control signal to lock the contactor in an open position until testing is complete. If the presence of one or more faults is detected, the controller can maintain the lockout of the motor controller contactor until the circuit breaker is opened to permit safe clearing of the faults before attempting another motor start-up.

Those of skill in the art will appreciate that if the motor branch circuit employs an inverter to control the motor in lieu of a motor starter, there is no intrinsic way for the controller of the test circuit to logically suppress motor start-up for purposes of performing ensuring proper testing. Thus, an isolating contactor can be interposed between the load side of the circuit breaker and the test points/motor. The isolating contactor can be configured in a normally open position, such that when a motor start-up is enabled by manually closing the circuit breaker, the test points and motor are already isolated from the presence of system AC power. The contactor can then be locked in the open state by the test circuit controller to effectively delay motor start-up until the test sequences of the invention are completed.

If no faults are determined to be present by the test circuit, the controller can open the contactor, thereby permitting the inverter to operate normally so that power can reach the motor and thus, enable motor start-up. If the presence of one or more faults is detected, the contactor operation can be locked out, or held in the open state to disable motor start-up until the circuit breaker is re-opened. This ensures safe conditions for personnel to clear the detected faults and that the motor branch circuit can enable subsequent motor started up without damage cause by the detected faults.

In the case of both types of motor branch circuits, the test circuit of the invention can provide an auditory/visual alarm to provide the operator with an indication that faults are present, and that motor start-up will not be permitted until the circuit breaker is opened and the faults are safely cleared. Other useful information regarding the detected faults can also be provided to the operator, including the type of fault (ground or short), the phase line(s) affected to help locate the fault(s), and the magnitude of the current flowing as a result. The foregoing theory of operation will now be discussed in more detail in view of the following description of specific embodiments of the invention as illustrated in the FIGS. 1-4.

Figure 1:
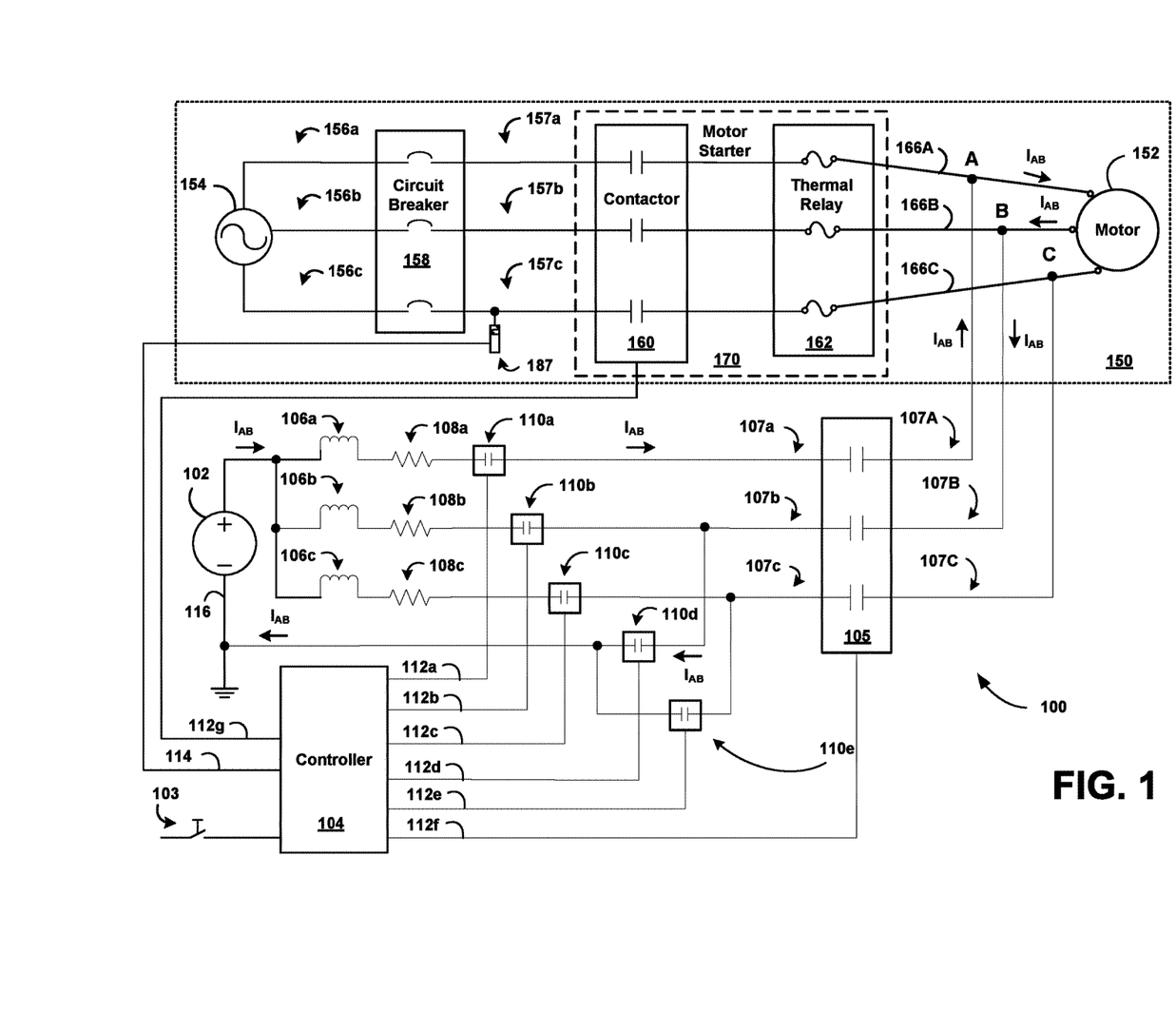
FIG. 1 is a simplified motor branch circuit that includes a motor control circuit in the form of a motor starter circuit, to which an embodiment of the test circuit of the invention is coupled for purposes of non-destructive testing of the motor branch circuit prior to its operation.
Figure 2:
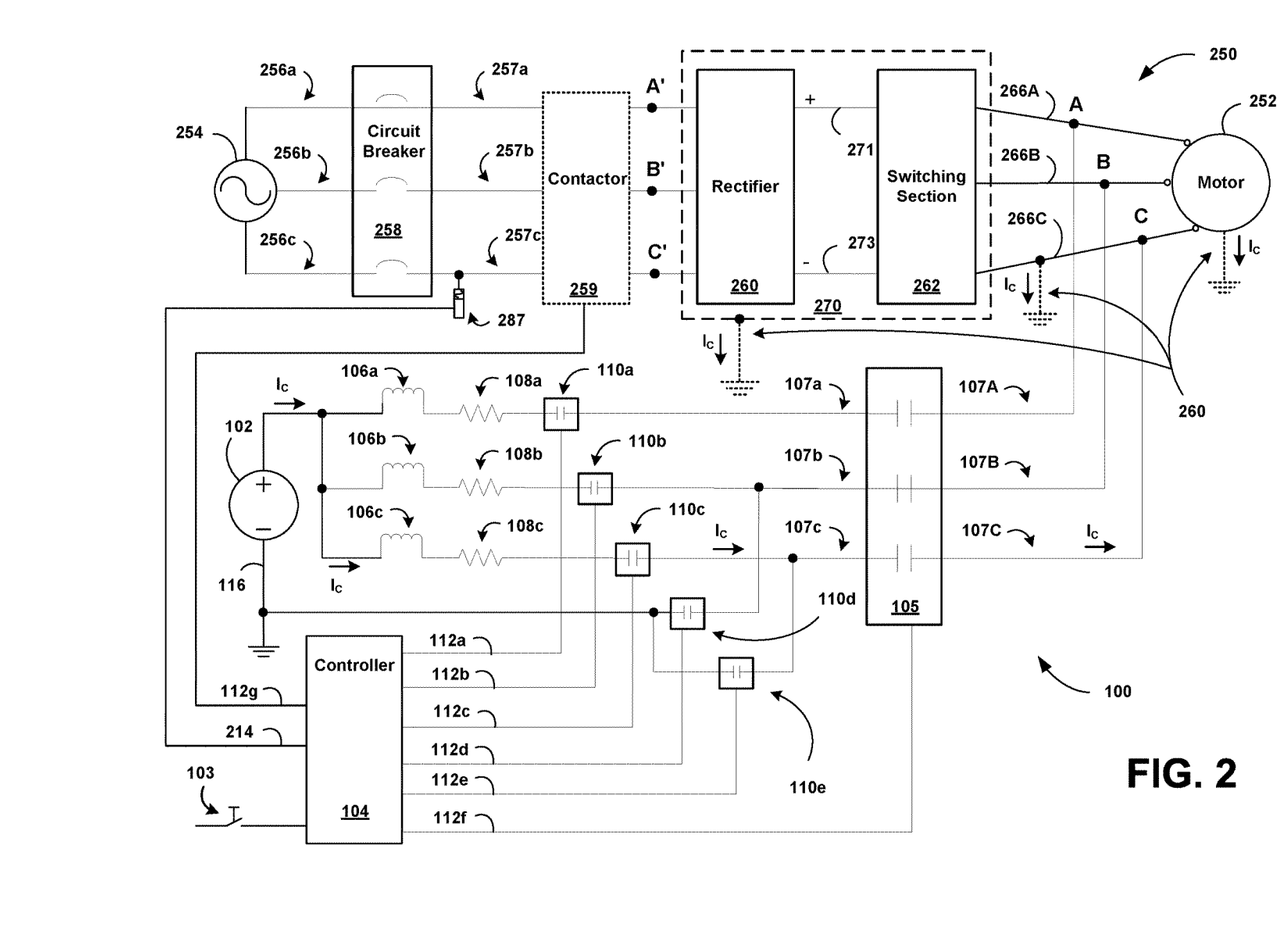
FIG. 2 is a simplified motor branch circuit that includes a motor control circuit in the form of an inverter circuit, to which an embodiment of the test circuit of the invention is coupled for purposes of non-destructive testing of the motor branch circuit prior to its operation.

FIGS. 1 and 2 illustrate two motor branch circuit topologies (150, FIGS. 1 and 250, FIG. 2), that differ from one another in the type of motor control circuit (motor starter 170, FIG. 1 and inverter circuit 250, FIG. 2) that they employ. Motor branch circuit (150, FIG. 1) employs motor starter 170, which includes a contactor 160 and a thermal relay 162. Motor branch circuit (250, FIG. 2) employs inverter circuit 270, with its rectifier 260 and power switching section 262. Both of these circuits are well-known to those of skill in the art. Those of skill in the art will appreciate that motor starter circuits 170, FIG. 1 are typically used to control the motor during start-up when (torque and slip and thus) load currents can be very high. Inverter circuit 270, FIG. 2 is often used for motors that must operate at variable speeds as it can control a motor's speed and torque as a function of load current rather than voltage.

As can be seen in both FIGS. 1 and 2, test circuit 100 of the invention can be coupled to test points A, B and C for either of these types of motor branch circuits 150, 250. Additional or alternate test points can be used for testing other portions of the motor branch circuits when desirable. For example, test points can be located at the input side of the motor control circuit for testing the input section of an inverter. This will be discussed in further detail later.

The illustrated examples of motor branch circuits (150, FIG. 1; 250, FIG. 2) both include three-phase inductive motors 152, 252 respectively. Those of skill in the art will appreciate that while most industrial motors are three-phase designs, the number of test lines of test circuit 100 can be scaled up or down to provide the testing sequences for any number of phase lines required. Upon motor start-up, and then during normal operation, each of the three phases of motors 152, 252 is energized by one of three phases derived from high-voltage AC power supply 154, 254, and each phase is supplied through one of three branches 156*a-c*, (FIG. 1) and 256*a-c*, (FIG. 2) of motor branch circuit 150, 250 respectively. Each branch 156*a-c*, (FIG. 1) and 256*a-c*, (FIG. 2) of the motor branch circuit 150, 250 is coupled to its unique phase of the AC power supply 154, 254 through circuit breaker 158, 258. Circuit breaker 158, 258 serves to couple and decouple each branch (156*a-c*, FIG. 1; 256*a-c*, FIG. 2) of the motor branch circuit 150, 250 to and from the AC system power supply 154, 254. This permits the branch motor circuit 150, 250 to be manually taken off line for maintenance and/or service/repair, as well as to be automatically shut down in response to load currents exceeding some maximum permissible magnitude during operation. As was previously mentioned, the motor branch circuit is typically brought online to enable motor start-up by closing the circuit breaker 158, 258.

As was previously discussed, the purpose of test circuit 100 is to perform sequences of testing functions that can identify the presence of dangerous and potentially destructive fault conditions proactively and preemptively, before motor 152, 252 is permitted to start, thereby avoiding destruction of components and the creation of dangerous conditions that can be caused by the presence of otherwise undetected faults present at the outset of motor start up. Moreover, because industrial motor circuit applications can require high AC voltage drawing high AC currents: 1) the test sequences performed by test circuit 100 must be performed in the absence of system AC power at the test points; and 2) the components of test circuit 100 must be isolated from the motor branch circuit (and system power) during start-up and normal operation of the motor branch circuit 150, 250. Put another way, test lines 107a-c of test circuit 100 should only be conductively coupled to motor branch circuit 150, 250 at test points A, B or C in the absence of system AC power at the test points.

In some embodiments of the invention, the test procedures performed by test circuit 100 can be manually initiated by an operator, for example, by actuating a switch 103 to provide a signal that triggers controller 104 to enter a test mode and begin the testing process as will be set forth in more detail below. In other embodiments, test mode can be triggered automatically (i.e. without intervention from a human operator) in response to, for example, the circuit breaker being closed to enable motor start-up. Automated testing requires that the test circuit suppress motor start-up, notwithstanding the coupling of system AC power, so that system power is not present at the test points while operating in test mode. This requires that the test points (as well as the motor) be isolated from the system AC power during test mode, notwithstanding that the circuit breaker has been closed to enable motor start-up by coupling system AC power to the motor branch circuit.

Those of skill in the art will appreciate that manually initiated testing can be particularly useful for field testing, where a field technician can couple a portable embodiment of the test circuit 100 to a motor branch circuit in advance of its use, while circuit breaker 158, 258 is open. Those of skill in the art will further appreciate, however, that an embodiment providing automated testing could be integrated as part of the motor branch circuit installation. Test circuit 100 could then be automatically initiated each time a motor start-up is enabled when an operator closes circuit breaker 158, 258. As discussed above, automated testing in response to the presence of system AC power requires a circuit that, under control of the test circuit, can prevent system AC power from reaching motor 152, 252 and the test points A, B and C until test circuit 100 completes testing. Moreover, an automated testing procedure would, in the presence of detected faults, maintain the lockout or suppression of the motor control circuit to disable motor start so long as the detected faults remain uncleared and circuit breaker 158, 258 remains closed.

Typically, motor start-up is enabled manually when an operator closes the circuit breaker 158, 258. Motor start up can then take place under control of the motor control device 170, FIG. 1; 270, FIG. 2, whenever there is a need for the motor to run. When the circuit breaker 158, 258 is closed, system AC power (supplied by AC Supply 154, 254) is typically provided to either motor starter 170 or inverter 270, which control the motor 152, 252 respectively. Thus, motor start-up is then enabled. Thus, automated testing cannot be performed unless there is a way to suppress or delay motor start-up from occurring immediately upon the closing of circuit breaker 158, 258, or while testing is under way. It is important that the test points A, B and C, as well as motor 152, 252 be initially isolated from system power (supplied by AC Supply 154, 254) upon entering test mode, and remain so until the test sequences performed by the test circuit 100 of the invention are completed.

As previously discussed, the primary difference between branch motor circuit 150, FIG. 1 and branch motor circuit 250, FIG. 2 is that the former employs a motor starter 170 and the latter employs an inverter 270. Motor branch circuit 150, courtesy of the motor starter 170, already includes a built-in, controllable isolating circuit in the form of contactor 160. Contactor 160 can be co-opted by test circuit 100 to isolate the test points A, B and C and motor 152 from the system AC power in the following manner. If an operator decides to enable motor start-up for motor branch circuit 150, the operator will manually close circuit breakers 158, thereby coupling AC system power from branch circuit AC power source 154 to the load side conductive connectors 157a-c of the branches 156a-c. A device such as a voltage controlled relay 187 can be coupled to one or more of conductive connectors 156a-c to detect the presence of the system AC power as an initiation of motor start-up for motor branch circuit 150. The output of the voltage controlled relay 187 can provide a signal 114 to controller 104 by which to cause controller 104 to initiate test mode.

To delay motor start-up, test circuit 100 must prevent system power from reaching the motor starter 170 or the inverter 270 (as well as test points A, B and C), until testing is complete. Because motor branch circuit 150 employs a contactor 160 in motor starter 170, a control signal 112g from controller 104 can be coupled to contactor 160 to maintain it in its normally open state (i.e. defeat its normal operation where it will respond to control signals that would otherwise lead to motor start-up. Control signal 114, generated by test circuit 100, can be coupled to the motor control circuit to suppress motor start-up and thereby prevent system AC power from reaching the motor and test points A, B and C during performance and completion of the testing sequences. If no faults are detected by test circuit 100, controller 104 can then release contactor 160 (through signal 114) to operate normally and thereby permit motor start-up to commence. If at least one fault is detected, controller 104 can lock or maintain contactor 160 in its open state under control of signal 114, thereby requiring an operator to open the circuit breakers 158 so that the identified faults can be cleared safely before attempting another start-up of motor branch circuit 150.

In contrast, branch motor circuit 250 has no contactor (it uses inverter 270 to control the motor instead). Thus, an isolator contactor 259 can be placed at the input of inverter 270 as shown in FIG. 2. Contactor 259 can be in a normally open state to isolate the entire inverter 270, as well as motor 252 and test points A, B and C from system branch circuit AC power supply 254 even after circuit breakers 258 are closed for purposes of initiating a motor start up. Once again, a voltage controlled relay or similar device 287 can be used to detect the presence of system AC power on at least one of load side connectors 257*a-c* of branches 256*a-c*. The voltage controlled relay can send signal 214 to controller 104 to initiate the test mode. Controller 104 can then provide control signal 112*g* to hold contactor 259 in the open state until the test sequences have been completely performed by test circuit 100. If the presence of no faults is detected, controller 104 can release contactor 259 through signal 112*g* to permit motor start-up to proceed. If the presence of one or more faults is identified, controller 104 can keep contactor 259 locked in the open state, so that operators are forced to open the circuit breakers 258, and safely clear the detected faults before another start-up attempt can be made.

Those of skill in the art will understand that there are various motor control circuits for starting and controlling induction motors such as motors 152, 252. Moreover, the different components involved will provide different potential sources for ground faults. Regardless of the type of motor control circuit used, as illustrated in FIGS. 1 and 2, the test circuit 100 can be coupled to the phase conducting cables at the same test points A, B and C, and test circuit 100 will function in the same manner to identify the presence of ground faults regardless of the components used to control the motor. Those of skill in the art will also recognize that any type of motor branch circuit, including one that already employs a contactor, could be modified as shown in FIG. 2 to add an additional contactor at the input of the motor control circuit for purposes of delaying motor start-up by isolating the motor control circuit from system branch circuit power supply 154, 254 until testing has been completed.

Those of skill in the art will appreciate that when it comes to the physical layout of typical motor branch circuits, circuit breaker 158, 268, as well as motor control components such as motor starter 170 or inverter 270, are most often located proximately to one another along with high voltage supply 154, 254. Thus, the likelihood of ground or line-to-line faults occurring in any of the conducting connectors, 157*a-c* of branches 156*a-c*, or even before the outputs of the motor starter 170 or inverter 270 is low. The more likely occurrence of such faults will be located between the outputs of the motor starter 170, inverter 270 and the inputs of motor 152, 252. The conducting cables 166A-C and 266A-C can be hundreds of feet long, depending upon how remote the motor 152, 252 is from the source of AC power 154, 254.

Test points A, B and C located on phase conducting cables 166A-C, FIGS. 1 and 266A-C, FIG. 2 provide a particularly pertinent location for testing for the presence of the most common occurrences of motor branch circuit faults. This test point location also has the benefit of testing the output section of an inverter circuit. Thus, test circuit 100 is configured in both FIGS. 1 and 2 to test for the presence of such faults for both motor branch circuits at test points A, B and C, located as shown along phase conducting cables 166A-C, FIGS. 1 and 266A-C, FIG. 2 respectively.

Notwithstanding, those of skill in the art will appreciate that in certain motor branch circuit implementations, testing for faults in other locations along the branches for each phase may be desirable. Alternate secondary test points A', B' and C' (see FIGS. 2 and 4), located at the outputs of isolating contactor 259, can be desirable for testing the inputs of the inverter circuit 270, and could also be used to test the integrity of a contactor 160 in a motor starter circuit 170 if deemed desirable. Those of skill in the art will appreciate that to test the integrity of contactor 160 in motor starter 170, the contactor 259 must be added to the motor branch circuit 150 to perform the isolating function, while the controller 104 closes the contactor 160 using a control output to facilitate the test. Additional embodiments of test circuit 100 can be adapted to test for faults at multiple sets of test points by multiplexing the test circuit 100 between the multiple sets of test points, as will be discussed later with respect to FIG. 4.

In an embodiment of the test circuit 100 as shown in both FIGS. 1 and 2, test circuit 10 has three test line outputs 107A, 107B and 107C, which are each coupled to one of the three test points A, B and C located on conducting cables 166A-C, 266A-C of the motor branch circuit 150, 250 respectively. Each of the three test line outputs 107A, 107B and 107C is coupled to its respective test point through isolating means 105. Isolating means 105 can be a bank of suitable switches, including electronically controlled solid state switches that each couples one of test lines 107*a-c* to test points A, B and C respectively when the switches are closed, and isolates the test lines from the phase lines 166A-C, 266A-C when they are open.

The switches of isolating means 105 can be opened and closed as a bank by controller 104 by way of control signal 112*f*. Isolating means 105 can be any form of switch that is suitable for coupling and decoupling the test lines 107*a-c* to and from the test points A, B and C. To be suitable, the isolating means 105 must be rated to provide isolation from the voltages that can be developed on the phase conducting cables 166A-C, 266A-C under the expected operating conditions of the motor branch circuit 150, 250. Suitable switches can include electronic solid-state relays, solid state switches, transistors and the like.

In the embodiment of the test circuit 100 of FIG. 1, each test line 107*a-c* serves to couple low voltage supply 102 to present low voltage supply 102 as a test voltage to its respective test point A, B and C. Each test line includes a current detecting/measuring device (106*a-c*), a current limiting resistor 108*a-c*, and a line switching means 110*a-c* that is opened and closed by a control signal 112*a-c* (respectively) generated by controller 104. The current sensors 106*a-c* can be any form of current sensor that is suitable to measure current at expected magnitudes, including magnetically coupled sensors as well as resistors. The current limiting resistors 108*a-c* may not be necessary, depending upon the expected magnitude of current resulting from detected faults. Those of skill in the art will recognize that the current limiting resistors can protect the components of the test line should large currents result during the testing process.

Those of skill in the art will recognize that once the isolating means 105 has been closed so that the test lines are conductively coupled to their respective test points, the switching means 110*a-c* can be independently opened and/or closed through their respective control signals by controller 104 in any order desired. Thus, each switching means 110*a-c* can be closed sequentially (while the other switching means remain open), thereby activating each test line to present the low voltage supply 102 as a test voltage sequentially to each test point in turn, one-at-a time. Any current flowing due to the presence of one or more ground faults associated with the phase line under test will be detected and measured by the current sensor 106*a-c* of the active test line.

In performing the first test sequence of the invention, those of skill in the art will appreciate that due to the nature of ground faults as being undesired pathways to ground, any currents flowing as a result of the presence of one or more ground faults will flow from the low voltage supply 102, through the activated test line 107*a-c* and ultimately through the fault to ground. For example, FIG. 2 illustrates current flow when isolating means 105 has been closed by controller 104 through activation of control signal 112f, and test line 107c has been activated by controller 104 by control signal 112c, and where one or more ground faults 260 are present in the branch motor circuit 250. Current $I_C$ flows from the low voltage supply 202, through test line 107c and output 107C to ground through one or more ground fault paths 260.

Those of skill in the art will appreciate that ideally, if no ground faults are present, $I_C$ as measured by current sensor 106c would be zero, and any amount of current measured greater than zero would be an indication of the presence of a ground fault. In the real world, there will be some level of acceptable leakage to ground. Thus, a threshold magnitude for $I_C$ can be established, at or below which no ground fault is identified by test line 107c, and above which the presence of a ground fault is identified. An appropriate threshold magnitude can be stored by controller 104, and upon activation, controller 104 can receive the magnitude measured by sensor 106 and perform a comparison between the sensed value of $I_C$ supplied to controller 104 and the threshold magnitude. If $I_C$ exceeds the threshold, the presence of a ground fault is identified in association with branch 266c and more specifically, phase conducting cable 266C. Controller 104 can provide an alarm, which could be visual or auditory or both, and can provide a display that indicates information regarding the faults, including for example: the branch associated with the fault, the test point location, and the magnitude of the measured test current $I_C$.

Figure 3:
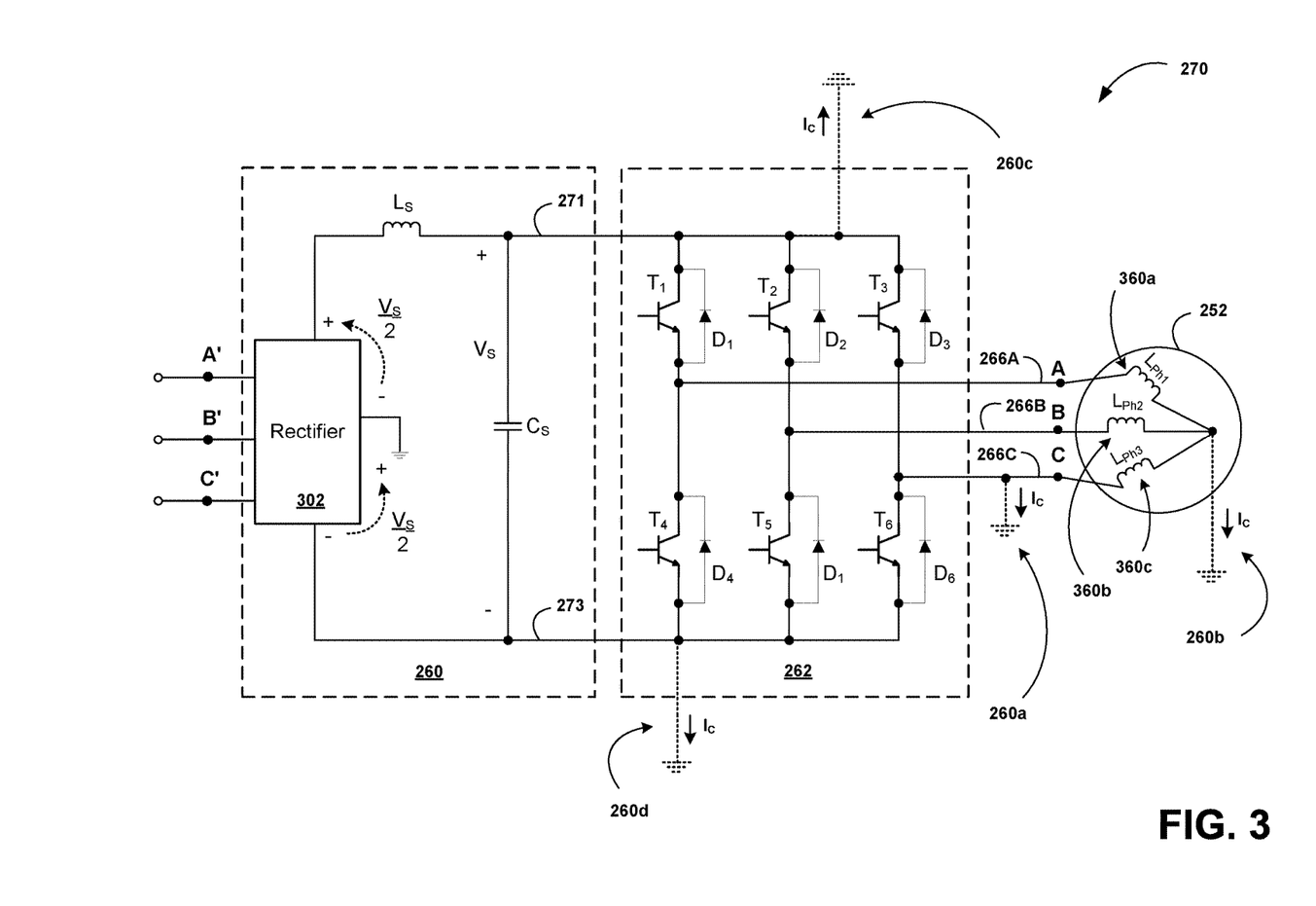
FIG. 3 is a simplified circuit diagram of the inverter and motor of FIG. 2, illustrating the paths of commonly occurring ground faults therein that can be detected by an embodiment of the test circuit of the invention prior to energizing the motor branch circuit.

As illustrated by FIG. 2, ground paths 260 can be internal to motor 252, can involve the phase conducting cable 266C directly, or could arise within the inverter 270. FIG. 3 shows a more detailed schematic of the inverter 270 and inductive motor 252, and illustrates some of the typical ground fault paths that can be present in both the rectifier section 260 as well as the power switching section 262. FIG. 3 illustrates a common inverter circuit, starting with the inputs corresponding to alternate secondary test points A', B' and C', rectifier 302 of rectifier section 260, power switching section 262, driving phase lines 266A-C having primary test points A, B and C thereon, coupled to phase coils $L_{PH1}$ 360a, $L_{PH2}$ 360b and $L_{PH3}$ 360c of motor 252. FIG. 3 shows multiple possible sources of ground faults that might cause or contribute to test current $I_C$. Leakage path 260a from phase conducting cable 266C can result from the wearing of insulation. Ground fault path 260b is internal to inductive motor 252. Ground fault paths 260c and 260d are common from positive (+) and negative (−) DC busses 273, 271 respectively. As can be seen from FIG. 3, primary test points A, B and C are going to detect most of the likely sources of ground faults, but alternate secondary test points A', B' and C' can be beneficial to testing the integrity of the input rectifier section 260 as well.

For purposes of performing the second test sequence of the invention, the embodiment of test circuit 100 as illustrated in both FIGS. 1 and 2 includes two additional switching means 110d and 110e. Switching means 110d and 110e, when closed using control signal 112d or 112e respectively, each able to provide a path back to the negative side of low voltage supply 102, through either test line 107b or test line 107c respectively. This enables test circuit 100 to apply the low voltage supply across pairs of phase conducting cables to further test for the presence of short-circuit (line-to-line) faults that can exist between any of the pairings of the phase conducting lines.

For example, to test for the presence of line-to-line faults between conducting cables 166A and 166B, FIG. 1 or 266A and 266B, FIG. 2, the controller 104 will close switch 110a using control signal 112a to couple the low voltage supply 102 to test point A on conducting cable 166A, 266A. Controller 104 will also simultaneously close switch 110d using control signal 112d to couple phase conducting cable 166B, 266B at test point B to the negative side of low voltage supply 102. If a short-circuit is present across the two phase cables 166A, 166B or 266A, 266B under test, a magnitude of current will flow in the two test lines that can be detected by both current sensors 106a and 106b, which will determine the measured value.

FIG. 1 illustrates a current flow $I_{AB}$ resulting from this scenario. When test line 107a is activated by closing switching means 110a, and test line 107b is activated as a return path to ground by closing switching means 110d, low voltage supply 102 is imposed across phase conducting lines 166A and 166b at their respective test points A and B. $I_{AB}$ flows from the positive side of low voltage supply 102, through the components of test line 107a, through the closed switch of isolating means 105, through the phase coils attached to the pair of phase cables 166A and 166B (equivalent to $L_{Ph1}$ 360a and $L_{Ph2}$ 360b of motor 252 in FIG. 3) back through the closed switch of isolating means 105, the components of test line 107c and finally back to the negative terminal of low voltage supply 102.

Those of skill in the art will recognize that a certain magnitude of current will be expected to flow in the two test lines, as the two test lines 107a and 107b are coupled through the two inductors $L_{PH1}$ 360a, $L_{PH2}$ 360b in the motor 152, which complete a circuit between them. Thus, a magnitude for the expected current can be established and stored with the controller 104. The magnitude of the current $I_{AB}$ as measured by both current sensors 106a and 106b can be transmitted to controller 104, where a comparison between the transmitted magnitude and the expected magnitude can be compared. If the transmitted magnitude for $I_{AB}$ flowing in the pair of test lines 107a, 107b exceeds the expected magnitude by a predetermined threshold, controller 104 identifies the presence of a short-circuit between the pair of phase conducting cables 107a, 107b. As with the ground fault test described above, controller 104 can provide a visual and/or auditory alarm to indicate the presence of the short-circuit, as well as display information regarding the nature of any detected faults, including the type of fault and with which of the phase conducting lines the fault is associated.

Figure 4:
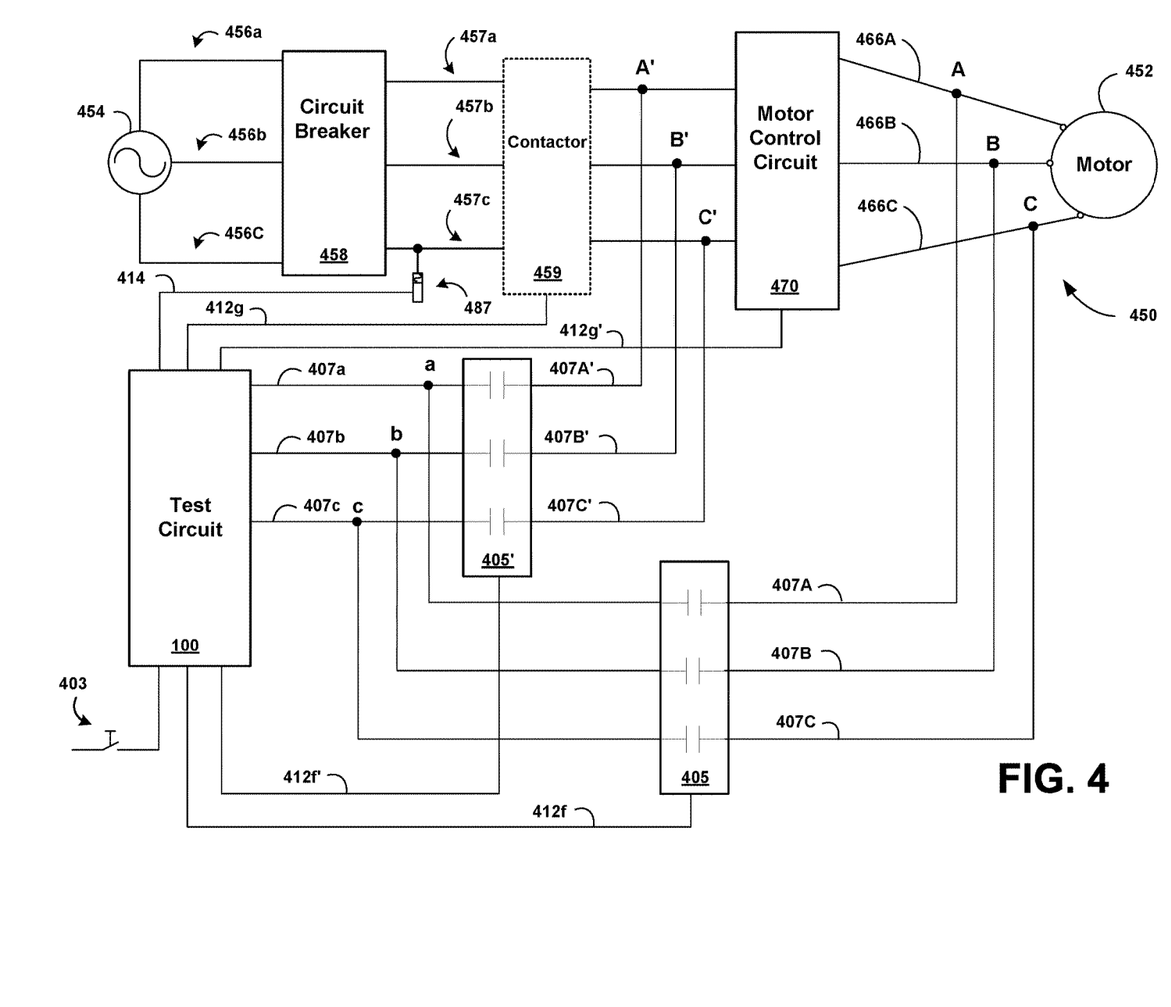
FIG. 4 is a circuit diagram illustrating an embodiment of the invention wherein multiple sets of test points may be established to test additional aspects of the motor branch circuit if desired.

FIG. 4 illustrates an amalgamation of the two types of branch circuits 150 and 250 of FIGS. 1 and 2 respectively, and a more simplified representation of test circuit 100. In FIG. 4, two sets of test points are provided through a multiplexing scheme whereby controller 104 can provide control signals 412f and 412f that each can control one of two different isolating means 405 and 405' respectively. Control signal 412f opens and closes the switches of isolating means 405 by which to couple the test lines 407a-c of test circuit 100 to perform the first and second sequences on outputs 407A-C at test points A, B and C. Control signal 412f opens and closes the switches of isolating means 405' by which to couple the test lines 407a-c of test circuit 100 to test points A', B' and C'.

Those of skill in the art will appreciate that this enables multiple sets of test points to be established at different locations long the branches of a motor branch circuit 150, 250 while using only a single test circuit 100. This can be beneficial if an end user wishes to test for faults at test points A, B and C to detect the various faults that can be evident at those points as previously discussed, but also effectively move the test lines to a second set of points that reveal further information regarding the health of the motor branch circuit installation at, for example, test points A', B' and C' at the inputs of inverter 270. Test circuit 100 would, in test mode, simply perform both of the first and second test sequences at each set of test points as previously described through one isolating means 405, 405', opening one isolating means to perform with the first and second test sequences thereon, and then opening the first and closing the second through control signals 412*f* and 412*f* from controller 104.

Figure 5A:
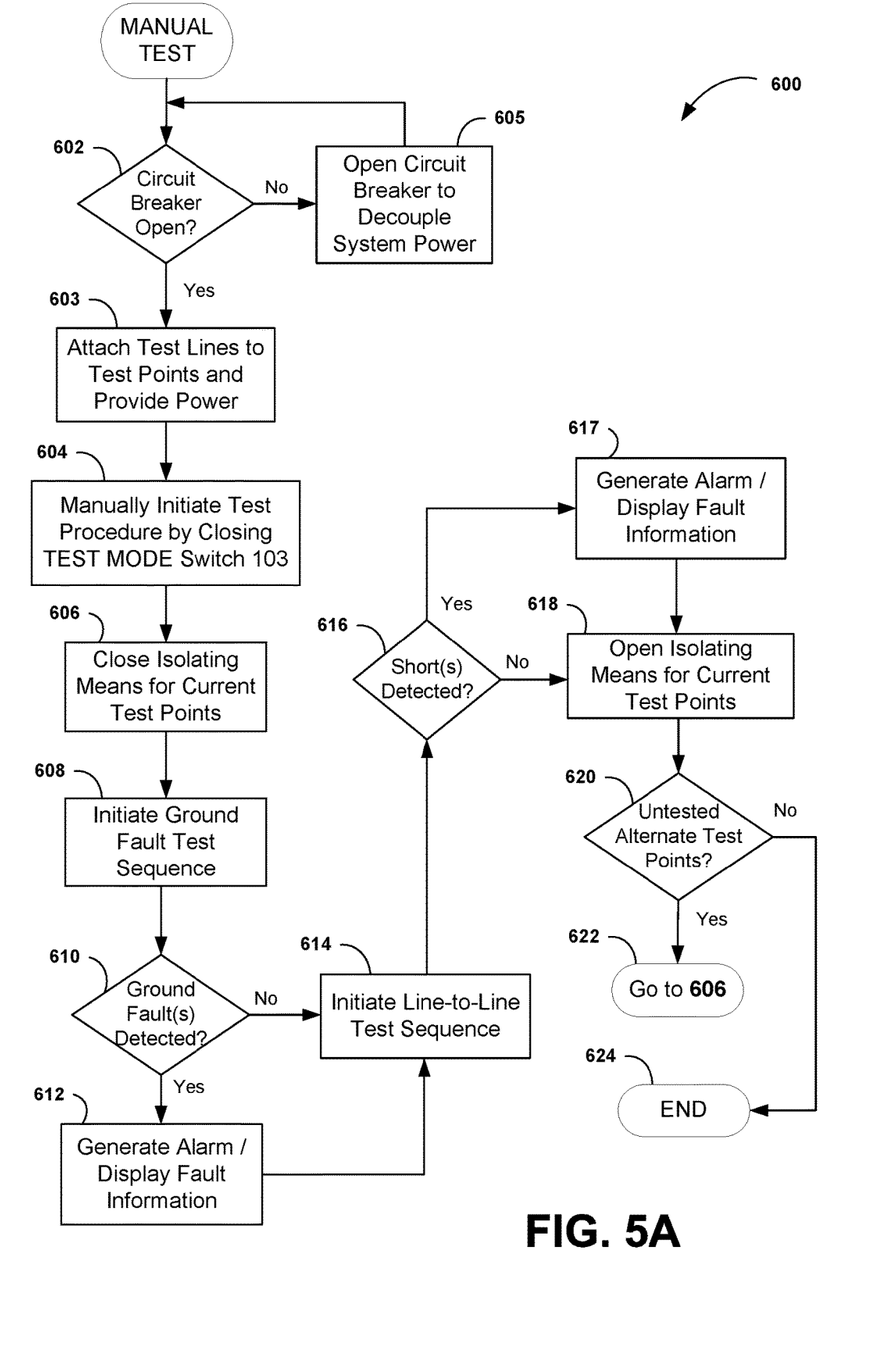
FIG. 5A is a procedural flow diagram illustrating an embodiment of a manually initiated test methodology performed by embodiments of the test circuit of the invention.

FIG. 5A illustrates an embodiment of a procedural flow of a manual test procedure 600, performed by test circuit 100 when placed into test mode manually by a user. Those of skill in the art will recognize that this embodiment is an effective way of using test circuit 100 in the field, when for example, a maintenance technician can quickly determine if a motor branch circuit installation requires repair, or if it is ready to be used at a later time. Moreover, it can be used regardless of whether isolating contactors are present in the motor branch circuit being tested, as the manual test is performed with circuit breaker 158, 258, 458 open. Such an embodiment could include test circuit 100 disposed in housing enclosure (not shown) with a dedicated source of power (e.g. battery and/or power cord) to provide test circuit 100 with operational power, including power supply 104. Those of skill in the art will appreciate that this separate power supply is important to this embodiment not only as it facilitates its portability, but also because it cannot derive its power from the system branch circuit AC power supply 154, 254, 454 because the circuit breaker must remain open during testing.

The embodiment of the method of the invention as shown in FIG. 5A is now described with reference to embodiments illustrated in FIGS. 1, 2 and 4. At block 602, it is determined whether the circuit breaker is open. If not open, the operator must manually open circuit breaker at block 605, preferably before test circuit 100 is coupled to the motor branch circuit 150, 250, 450. If the answer at block 602 is "YES," the test output lines 107A-C of circuit 100 are coupled to the desired test points (e.g. A, B and C) at block 603. At block 604, an operator the testing sequences performed by test circuit 104 by closing a manually actuated switch 103 to provide a signal to controller 104, thereby initiating controller 104 into the test mode of the invention.

At block 606, controller 104 activates control signal 112*f*, 412*f* to close the bank of switches 105, 405 to couple the test lines 107*a-c* to test outputs 107A-C and thus, to test points A, B and C. With reference to FIG. 4, those of skill in the art will recognize that the order in which two or more sets of test points are tested can be established by the programming of controller 104. Thus, in this example, test points A, B and C are chosen to be the "current" set of test points at this point in the processing. At block 608, controller 104 initiates the first ground fault test sequence, wherein each test line is, in turn, coupled to the low voltage supply 102, 202, 402. Controller 104 closes each switching means 110*a-c* one at a time using control signals 112*a-c*, whereby the low voltage supply 102 is presented as a test voltage to each respective phase conducting cable 166A-C, 266A-C, 466A-C at their respective test points A, B and C.

As each individual test line is, in-turn, activated and coupled to the low voltage supply, any current flowing in the test line will substantially be the result of leakage paths to ground as previously discussed. The magnitude of any current will be measured by current sensors 108*a-c* respectively, and the magnitude for each test line is input to controller 104, where it is compared to a predetermined threshold magnitude. If the measured magnitude for current flowing in any one of the three test lines when activated exceeds the threshold, a ground fault is determined to be present in the branch associated with that test line and the answer at decision block 610 is "YES."

Processing continues at block 612, where an alarm can be generated to alert human operators that a fault exists and that motor start-up should not proceed. The alarm can be visual, auditory or both. Controller 104 can also be coupled to a visual display that can provide useful information concerning the detected fault(s), including but not limited to, the specific branch (or phase) for which each fault is detected, test point location, the magnitude of the current detected, as well as its nature (e.g. it is a ground fault).

Processing then continues at block 614, where processing would have continued had the answer at decision block 610 been "NO." At block 614, controller 104 initiates line-to-line testing between each possible pairing in turn and one at a time, of the phase conducting cables 166A-C, 266A-C, 466A-C. To place the low voltage supply across contact points A and B, controller 104 will activate test line 107*a* by using control signal 112*a* to close switching means 110*a*, and will activate test line 107*b* by closing switching means 110*d* using control signal 112*d*. This creates a complete circuit between test points A and B.

A certain magnitude of current will be expected to flow in this circuit, (including the two test lines) in the absence of any line-to-line faults, and that magnitude can be calibrated and used to establish a threshold magnitude. Controller 104 will receive and compare the magnitude of the current measured by current sensors 106*a, b* to the threshold (expected current plus some percentage of the expected current) and if the threshold is exceeded, a line-to-line short-circuit fault will be identified as being present between that pairing of phase lines. Each possible pairing is tested one at a time, in the same manner. Controller 104 will then place the low voltage supply 102 across test points B and C by activating test line 107*b* through switching means 110*b* using control signal 112*b* and test line 107*c* through switching means 110*e* using control signal 112*e*. Finally, controller 104 places low voltage supply 102 across test points A and C by activating test line 107A through switching means 110*a* using control signal 112*a* and line 107*c* through switching means 110*e* using control line 112*e*.

Processing continues to decision block 616, where the answer is "YES" if one or more pairs are determined to have a line-to-line fault between them. If the answer is "YES" processing proceeds to block 617, where an alarm can be generated as previously described for ground faults. Also, details of any detected faults can be provided through a graphical user interface (GUI) coupled to controller 104 as is known in the art, including the specific pairings that conduct short-circuit level current flowing when tested.

Processing then continues at 618, where processing would have continued had no faults been detected at 616. At block 618, controller 104 opens the switches of isolating means 105, 405 using control signal 112*f*, 412*f* to electrically uncouple the test lines 107*a-c*, 407*a-c* of test circuit 100 from the current set of test points A, B and C located on the motor branch circuit 150, 250, 450. Processing continues at block 620, where it is determined if one or more alternate or secondary sets of test points exist that have not yet been tested. If "YES," processing continues block 622 where processing jumps back to block 606, where the isolating means (e.g. 405', FIG. 4) is closed using control signal 412*f*, and processing proceeds as previously described at new current test points A', B' and C'. If the answer at 616 is "NO," processing ends at 624.

When testing manually in accordance with manual procedure 600, those of skill in the art will understand that if any faults have been identified, motor start-up should not be manually initiated before all faults so identified by test circuit 100 have been cleared to avoid dangerous conditions and possible circuit damage. If no faults are identified, motor start-up may be initiated by then closing the circuit breaker 158, 258, 458.

Figure 5B:
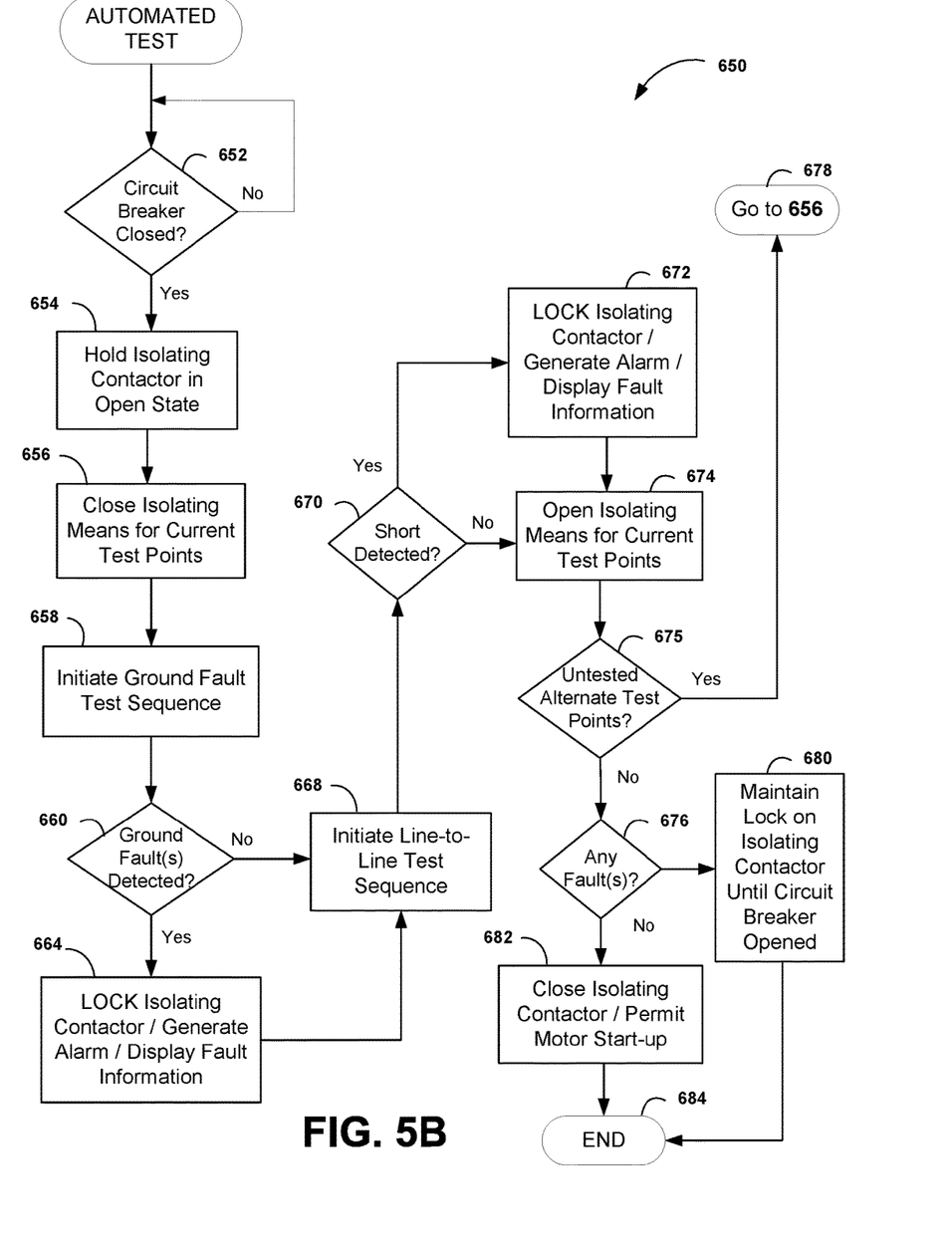
FIG. 5B is a procedural flow diagram illustrating an embodiment of an automated test methodology that is initiated in response to a motor start-up and is performed by embodiments of the test circuit of the invention.

FIG. 5B illustrates an embodiment of test circuit 100 that is more configured for more permanent integration with the motor branch circuit installation. Automated test procedure 650 of the invention can be employed when used in conjunction with an electronically controlled isolating circuit, such as isolating contactor 160, 259, 459 as previously discussed. In this procedure, the test mode can be automatically initiated in response to detection of system AC voltage at the load side of circuit breaker 158, 258, 458. This indicates an operator has enabled a motor start-up. In this way, a non-destructive test procedure can be initiated automatically every time a motor is started, without direct intervention by the operator other than to close the circuit breaker 158, 258, 458 to initiate the start-up.

In embodiments of test procedure 650, power for test circuit 100 can be separate from system AC power, or can be provided by way of system branch circuit AC power supply 154, 254, 454. In the former situation, it is important that system AC power at the load side of the circuit breaker be detected to initiate test mode. However, if power for the test circuit 100 is derived from system branch circuit AC power supply 154, 254, 654, test circuit 100 will not power up until the circuit breaker is closed. In that case, it may not be necessary to detect the presence of system branch circuit AC power as the test circuit could be configured to enter test mode on power up in response to the circuit breaker being closed to enable motor start-up.

Procedure 650 begins at decision block 652, where controller 104 enters test mode. Test mode can be initiated through a control signal 114, 414 to cause controller 104 to enter test mode when the answer at 652 is "YES." As previously discussed, this occurs in response to an operator closing circuit breaker 158, 258, 458 to enable a motor start up. This signal can be detected in a number of ways, including detecting the presence of system branch circuit AC voltage at the load side (157*a-c*, FIG. 1; 257*a-c*, FIG. 2; 457*a-c*, FIG. 4) of the circuit breaker 158, 258, 458 using, for example, a voltage controlled relay 187, 287, 487. As previously discussed, entering test mode could also simply be in direct response to test circuit 100 powering up when receiving system AC power from branch circuit supply 154, 254, 454 when the circuit breaker is closed. In that case, control signal 114, 414 and relay 187, 287, 487 may not be necessary.

Next at block 654, a control signal 112*g* from controller 104 is provided to a contactor (160, FIG. 1; 259, FIG. 2; 459, FIG. 3) to maintain the contactor in an open state to block the system AC voltage provided by branch circuit AC supply 154, 254, 454 from reaching the motor 152, 252, 452, and thereby delaying the onset of motor start-up. The isolating contactor can be contactor 160, which is already part of the motor starter 170 of FIG. 1, or it can be an isolating contactor that has been placed at the input of inverter 270 of FIG. 2 to temporarily prevent the system power provided by high voltage branch circuit supply 252 from reaching the inputs of inverter 270.

Those of skill in the art will recognize that in motor branch circuit 450, the isolating contactor 459 could be used even when motor control circuit 470 is motor starter, and therefore in lieu of the contactor 160 therein. This might be useful should one wish to test the input side of the motor starter 170. In that case, control signal 412*g* will control isolating contactor 459 and control signal 412*g'* will control contactor 160. In that case, contactor 160 will be controlled with signal 412*g'* to be open when testing is performed at test points A, B, C and will be closed using signal 412*g'* when testing at test points A', B' and C'. Those of skill in the art will recognize that failures of the motor starter 170 are rare and therefore the added expense of providing an additional isolating contactor 259 to provide isolation in lieu of a contactor already provided with the motor starter may not be warranted or desirable.

Processing continues at block 656, where controller 104 activates control signal 112*f*, 412*f* to close the bank of switches 105, 405 to couple the test lines 107*a-c* to test outputs 107A-C and to current set of test points A, B and C. At block 658, controller 104 initiates the first test sequence which tests for ground faults as previously described. Each test line is, in turn, coupled to the low voltage supply 102 as controller 104 closes each switching means 110*a-c*, one at a time, using control signals 112*a-c*, whereby the low voltage supply is presented as a test voltage to each respective phase conducting cable 166A-C, 266A-C, 466A-C at their respective test points A, B and C. This ground fault sequence is performed in the same manner as described in detail above with respect to FIG. 5A, and thus will not be repeated here.

If the measured magnitude for current flowing in any one of the three test lines when so activated exceeds a predetermined threshold as previously described, a ground fault is determined to be present in the branch associated with that test line and the answer at decision block 660 is "YES." Processing then continues at block 662, where contactor 160, 259 or 459 is effectively locked in its normally open state until the operator closes circuit breaker 158, 258 to clear the detected faults.

Processing continues at block 664 where the isolating contactor is locked in the open position not only until testing is complete, but will remain locked until the circuit breaker is re-opened so that faults can be cleared. An alarm can be generated to alert human operators that a fault exists and that motor start-up will not proceed. The alarm can be visual, auditory or both. Controller 104 can also be coupled to a visual display that can provide useful information concerning the detected fault(s), including but not limited to, the specific branch in which each fault is detected, the magnitude of the current detected, as well as its nature (e.g. it is a ground fault).

Processing then continues at block 668, where processing would have continued had the answer at decision block 660 been "NO." At block 668, controller 104 initiates the second test sequence, which performs line-to-line testing between each possible pairing of the phase conducting cables 166A-C, 266A-C, 466A-C, in turn and one at a time. The process of performing line-to-line fault testing has been described in detail above with respect to FIG. 5A, and will not be repeated here. The testing sequence is otherwise performed in the same way in both procedural flows 600, FIG. 5A and 650, FIG. 5B.

Processing continues to decision block 670, where if the answer is "YES," one or more pairs have been determined to have a line-to-line fault between them based upon the second test sequence. At block 672, processing continues where isolating contactor 160, 259 or 459 is effectively locked in its normally open state (if not already locked at block 664) until the operator opens circuit breaker 158, 258 to clear the detected faults. At block 672, an alarm can be generated as previously described for ground faults at block 664. Details of any detected faults can be provided through a graphical user interface (GUI) coupled to controller 104 as is known in the art, including the specific pairings that measured short-circuit level current flowing therethrough when tested. Processing continues to block 675 where the isolating means 105, 405 is opened to disconnect the test circuit 100 from the current set of test points A, B and C. Processing then ends at 676.

Processing then proceeds to block 674 where controller 104 opens up isolating means 105, 405 to disconnect the test circuit 100 from the current set of test points A, B and C. Processing continues at decision block 675, where it is determined if any additional sets of test points are to be tested. If the answer is "Yes," processing continues at block 678, where controller 104 jumps back to block 656 and closes the isolating means for the next current set of test points to be tested. Processing continues from there as previously described and testing continues at the current set of test points. As applied to FIG. 4, the next new set of current test points becomes A', B' and C'. When processing jumps back to block 656, isolating means (e.g. 405', FIG. 4) is closed using control signal 412*f*, and processing proceeds as previously described above.

If the answer at decision block 675 is "NO," processing continues at decision block 676, where it is determined if there had been any faults detected previously at either of blocks 660 or 670. If the answer is "YES," processing continues at block 680, where the lock maintaining the open state of isolating contactors 160, 259, 459 remains in place until an operator opens circuit breakers 158, 258, 458 to clear the identified faults. Test mode then ends at 684. If the presence of no faults had been previously identified at blocks 660, 670 during the first and second test procedures, and thus the answer at decision block 676 is "NO," processing continues at block 682, where controller 104 either releases contactor 160 (to freely operate as part of the motor starter circuit 170) or closes isolating contactor 259, 459 to permit branch circuit AC voltage 154, 254, 454 to reach the motor control circuit 470, thereby permitting motor start-up. Test mode processing then ends at 684.

Controller 104 of test circuit 100 can be any programmable processor or microcontroller that can execute software instructions stored in non-transitory memory that results in controlling test circuit 100, as well as certain components of the motor branch circuit 150, 250, 450 through input/output control signals coupled thereto as herein described, to perform embodiments of the test methodology as set forth above. Other types of control circuits, such as sequential circuits or combinations of processors and combinatorial logic circuits can also be used. Processor and memory combinations can include laptops, desk tops, PDAs and other similar devices that have displays that can provide graphical user interfaces by which to interact with human operators and receive inputs from users.

Those of skill in the art will recognize that other embodiments of the invention are possible without exceeding the intended scope of the invention. For example, the order in which functions are performed as described by the methodologies as described in FIGS. 5A-B are merely representative of the general flow of the test process, and are not intended to be taken literally. Functions can be performed in other orders, so long as they are consistent with the achieving the benefits of the invention as described herein. For example, the two test sequences may be performed in the opposite order, with line-to-line faults tested first, and then ground faults.

In addition, the switching and isolating means can be any suitable manually, electrically or electronically actuated switch that is suitable for performing the functionality describe herein. For example, switching means 110*a*-*e* can also be AC switches, to permit the use of an AC low voltage supply for low voltage supply 104. Finally, test circuit 100 can be applied to any motor branch circuit having any number of phases, and is not limited to just three branch motor circuits. Those of skill in the art will understand that the number of branches of a motor branch circuit is dictated by the number of phases required by the motor design. While few motor designs employ greater than three phases, it will be readily apparent to those of skill in the art that the test circuit of the invention 100 is scalable to test any number of branches.

What is claimed is:

1. A test circuit for performing nondestructive detection of faults in a motor branch circuit, the motor branch circuit including two or more phase lines, each phase line coupling a phase inductor of a motor to a different phase of a branch circuit AC supply voltage through a circuit breaker, the test circuit comprising:
    a low voltage power supply;
    a primary isolating means;
    a test controller; and
    a plurality of test lines, each configured to be coupled to a different one of the phase lines at a unique one of a primary set of test points, the primary isolating means for conductively coupling each of the test lines to the phase line at the unique one of the set of test points to which it is coupled when in a closed state, and for isolating each of the test lines from the phase line to which it is coupled when in an open state, each of the test lines including:
        a current sensor for sensing current flowing in the test line; and
        a first switching means for coupling and decoupling, in response to a first control signal from the test controller, a positive terminal of the low voltage supply to the phase line to which the test line is coupled when the primary isolating means is in a closed state, and
    wherein at least some of the test lines further include a second switching means for coupling and decoupling, in response to a second control signal from the controller, a negative terminal of the low voltage supply to the phase line to which the test line is coupled when the primary isolating means is in a closed state, and
    wherein when the test circuit is placed in a test mode, the test controller is configured to perform a short-circuit test sequence including:
        sequentially controlling the test lines to present the test voltage across each possible pairing of the phase lines coupled thereto, each pairing including one test line having its respective first switching means closed by the controller and one of the at least some test lines having its respective second switching means closed by the controller,
        sensing the magnitude of current flowing through each of the pairings of test lines while the test voltage is applied across the pairing using the current sensor of at least one of the paired test lines, and
        identifying a line-to-line fault between any of the pairs of phase lines when the sensed magnitude for the pairing exceeds an expected magnitude of current by a predetermined short-circuit threshold.

2. The test circuit of claim 1, wherein:
the motor branch circuit includes a motor control circuit, the outputs of the motor control circuit being coupled to the motor through the phase conducting cables, and
each of the primary set of test points being located at a termination of a different one of the phase conducting cables between the outputs of the motor control circuit and the motor.

3. The test circuit of claim 2 wherein the test circuit is configured to enter the test mode in response to a manually actuated test mode control signal being received by the test controller while the branch circuit AC supply voltage is electrically isolated from the primary set of test points by the circuit breaker in its open state.

4. The test circuit of claim 2 wherein the test circuit is configured to enter the test mode automatically in response to an automated test mode control signal being received by the test controller, the automated test mode control signal being generated in response to the circuit breaker being closed to enable motor start-up, the branch circuit AC supply voltage being electrically isolated from the primary set of test points by an isolating circuit of the motor branch circuit that is maintained in an open state to suppress motor start-up for at least while the test circuit is in test mode.

5. The test circuit of claim 4, wherein whenever at least one fault has been detected by the test circuit during test mode, the isolating circuit of the motor branch circuit is maintained in its open state by the test controller until the circuit breaker is opened.

6. The test circuit of claim 5 wherein when the test circuit is placed in the test mode, the test controller is further configured to perform a ground fault test including:
sequentially controlling each of the test lines, in turn, using the first switching means, to apply the positive terminal of the low voltage supply as a test voltage to the phase line coupled thereto, and
identifying a ground fault to be present for any of the phase lines when a magnitude of current detected by the current sensor of the test line, when coupled to the test voltage, exceeds a predetermined ground fault threshold with the test voltage applied thereto.

7. The test circuit of claim 6, wherein:
the motor control circuit is a motor starter for controlling the motor during start-up, the motor starter including a contactor, and
the contactor of the motor starter is controlled to remain locked in an open state by the test controller to act as the isolating circuit of the motor branch circuit during test mode.

8. The test circuit of claim 6, wherein:
the motor control circuit is an inverter circuit, and
the isolating circuit of the motor branch circuit is an isolating contactor that is placed in the phase lines in series between the circuit breaker and the input of the inverter circuit, and
the isolating contactor is controlled by the test controller to remain in an open state during test mode and is further maintained by the test controller in a closed state during normal operation of the motor branch circuit.

9. The test circuit of claim 2, wherein the first and second switching means are bi-directional and the low voltage supply is AC.

10. The test circuit claim 1, wherein the magnitude of the current detected by the current sensor of each test line is transmitted to the test controller when the test line is under test, and the test controller compares the sensed magnitude to the predetermined short-circuit threshold to identify a short circuit fault being present in any pairing where the magnitude exceeds the threshold.

11. The test circuit of claim 10, wherein the test controller displays information regarding each identified short-circuit fault through a GUI (graphical user interface), including the pairing associated with each identified short-circuit fault.

12. The test circuit of claim 8, wherein:
a secondary set of test points are located on the phase lines between the inputs of the inverter and the isolating contactor, and
each of the secondary set of test points is located on a different one of the one or more phase lines, each test line being coupled to a unique one of the test points through a secondary isolating means is closed and the primary isolating means is open.

13. The test circuit of claim 12, wherein the test controller is configured to perform the short-circuit test sequence and the ground fault test sequence at the secondary set of test points when the test controller closes the secondary isolating means and the primary isolating means is open.

14. A test circuit for performing nondestructive detection of faults in a motor branch circuit prior to motor start-up, the motor branch circuit including at least two phase lines, each coupling one phase inductor of a motor to a different phase of a branch circuit AC supply voltage through a circuit breaker, the test circuit comprising:
a low voltage power supply;
an isolating means;
a test controller; and
a plurality of test lines, each configured to be coupled to a different one of the phase lines at a unique one of a set of test points, the isolating means for conductively coupling each of the test lines to the phase line at the unique one of the set of test points to which it is coupled when in a closed state, and for isolating each of the test lines from the phase line to which it is coupled when in an open state, each of the test lines including:
a current sensor for sensing current flowing in the test line; and
a switching means for coupling and decoupling, in response to a first control signal from the test controller, a positive terminal of the low voltage supply to the phase line to which the test line is coupled when the isolating means is in a closed state, and;
wherein when the test circuit is placed in a test mode in response to a test mode control signal being received by the test controller, the test controller is configured to perform a ground fault test including:
switchably controlling each of the test lines, in sequence, using the switching means, to apply the positive terminal of the low voltage supply to the phase line coupled thereto, and
determining that a ground fault is present for any of the phase lines when a magnitude of current measured by the current sensor of the test line exceeds a predetermined ground fault threshold with the test voltage applied thereto.

15. The test circuit of claim 14 wherein the test circuit is configured to enter the test mode automatically in response to an automated test mode control signal being received by the test controller, the automated test mode control signal being generated in response to the circuit breaker being closed to enable motor start-up, the branch circuit AC supply voltage being electrically isolated from the set of test points by an isolating contactor.

16. The test circuit of claim 15 wherein the isolating contactor is in a normally open state, and is maintained in its open state by a control signal from the test controller for at least so long as the test circuit remains in test mode, and wherein the isolating contactor is maintained in its open state by the controller until the circuit breaker is opened, whenever at least one fault has been detected by the test circuit during test mode.

17. A method for nondestructive detection of faults in a motor branch circuit, the motor branch circuit including two or more phase lines, each coupling one phase inductor of a motor to a different phase of a branch circuit AC supply voltage through a circuit breaker, the circuit breaker for coupling and decoupling the phase lines from the branch circuit AC supply voltage, the method comprising:

isolating the AC supply voltage from at least a primary set of test points, each test point of the set located on a different one of the phase lines;

performing a ground fault test sequence comprising:
applying a low voltage supply as test voltage sequentially to each of the phase lines at their respective test points;
measuring the magnitude of current flowing in each one of the phase lines while the test voltage is being applied thereto; and
detecting that a ground fault is present and associated with the at least one phase line when the measured current flow therethrough has a magnitude that exceeds a predetermined ground fault threshold; and performing a line-to-line short circuit test sequence comprising:
applying the low voltage supply as a test voltage sequentially across each possible pairing of the phase lines at their respective test points;
measuring the magnitude of current flowing through each of the pairings of the phase lines as the test voltage is applied, and
detecting that a line-to-line fault is present between the phase lines of each pairing for which the magnitude of the current therebetween exceeds an expected current flow by a predetermined short-circuit threshold; and
whenever at least one line-to-line and/or ground fault is detected, preventing the motor from starting up until the fault has been cleared.

18. The method of claim 17, wherein the ground fault and line-to-line test sequences are performed automatically in response to entering a test mode, the method further comprising:
detecting when the circuit breaker is closed to enable a start-up of the motor,
entering the test mode in response to the circuit breaker being closed; and
isolating the AC supply voltage from the set of test points using a contactor in a normally open state, wherein the open state is maintained for at least the duration of the test mode to suppress motor start-up for at least the duration of test mode.

19. The method of claim 18, wherein:
the motor branch circuit includes a motor starter, the motor starter including a contactor for controlling the motor during start-up and normal operation, and
the contactor of the motor starter is controlled by the test controller to remain in the open state during test mode.

20. The method of claim 18, wherein:
the motor branch circuit includes an inverter circuit, and an isolating contactor is placed between the circuit breaker and the input of the inverter circuit, the isolating contactor being controlled by the test controller to remain locked in the open state during test mode.

* * * * *